United States Patent
Economikos et al.

(10) Patent No.: US 6,359,300 B1
(45) Date of Patent: Mar. 19, 2002

(54) HIGH ASPECT RATIO DEEP TRENCH CAPACITOR HAVING VOID-FREE FILL

(75) Inventors: Laertis Economikos; Byeongju Park, both of Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/712,708

(22) Filed: Nov. 14, 2000

Related U.S. Application Data

(62) Division of application No. 09/162,100, filed on Sep. 28, 1998, now Pat. No. 6,180,480.

(51) Int. Cl.⁷ .............................................. H01L 27/108
(52) U.S. Cl. ........................................ 257/301; 438/386
(58) Field of Search .......................... 257/301; 438/243, 438/245, 246, 247, 386, 388, 389

(56) References Cited

U.S. PATENT DOCUMENTS

| | | | |
|---|---|---|---|
| 4,526,631 A | 7/1985 | Silvestri et al. | 148/175 |
| 4,853,076 A | 8/1989 | Tsaur et al. | 156/603 |
| 5,110,759 A | 5/1992 | Mukai | 437/173 |
| 5,130,885 A | 7/1992 | Fazan et al. | 361/313 |
| 5,147,819 A | 9/1992 | Yu et al. | 437/173 |
| 5,190,889 A | 3/1993 | Poon et al. | 437/67 |
| 5,254,873 A | 10/1993 | Poon et al. | 257/751 |
| 5,318,923 A | 6/1994 | Park | 437/188 |
| 5,665,659 A | 9/1997 | Lee et al. | 438/646 |
| 5,677,219 A | 10/1997 | Mazureet et al. | 437/52 |
| 5,897,370 A | 4/1999 | Joshi et al. | 438/632 |
| 5,994,718 A * | 11/1999 | Demirlioglu | 257/65 |
| 6,080,618 A * | 6/2000 | Bergner et al. | 438/243 |
| 6,194,755 B1 * | 2/2001 | Gambino et al. | 257/301 |

FOREIGN PATENT DOCUMENTS

JP 1204442 2/1988

OTHER PUBLICATIONS

"New low pressure chemical vapor deposition technique for Ge crystalline thin films" by M. Yamamoto & J.Hanna. Appl. Phys. Lett. 63(18), Nov. 1, 1993. pp. 2508–2510.

"Strain relaxation and dislocations in SiGe/Si structures" by P.M. Mooney. Material Science and Engineering, R17(1996) Reports: A Review Journal. pp. 105–109.

"Ge–Si (Germanium–Silicon)" by R.W. Olesinski & G.J. Abbaschian. Binary Alloy Phase Diagrams, Second Edition. 1990. pp. 2000–2001.

"Initial growth characteristics of germanium on silicon in LPCVD using germane gas" by S. Kobayashi et al. Journal of Crystal Growth 174 (1997) pp. 686–690.

(List continued on next page.)

Primary Examiner—David Nelms
Assistant Examiner—Quoc Hoang
(74) Attorney, Agent, or Firm—Ratner & Prestia; Jay H. Anderson, Esq.

(57) ABSTRACT

A trench capacitor comprising a substrate, a trench formed in the substrate, and conductive doped germanium or silicon-germanium alloy fill material completely filling the trench. The process for creating the capacitor comprises depositing the conductive doped germanium or silicon-germanium alloy in the trench and in a fill layer over the substrate and annealing the wafer at a temperature at which the fill layer melts and completely flows into the trench but the wafer does not melt. The process further includes depositing a silicon cap layer on top of the fill layer to prevent oxidation of the fill layer. The trench may further include one or more of a buffer layer, a metal layer, and a thermal-stress-reduction layer between the trench walls and the fill material.

9 Claims, 3 Drawing Sheets

OTHER PUBLICATIONS

"Growth of a Ge–Si–Ge(100) heterostructure by very low pressure chemical vapour deposition using Si2H6 and GeH4 gasses–photoemission and low energy diffraction studies" by F. Ringeisen. Materials Science and Engineering B28 (1994) pp. 14–17.

"Ge composition and temperature dependence of the deposition of SiGe layers" by S. Gu et al. American Institute of Physics J. Appl. Phys. 75 (10), May 15, 1994. pp. 5382–5384.

"Optical Isolation Trench" by Y.C. Sun. IBM Research Disclosure N263 03–86 (WPAT and TDBS) Thomas J. Watson Research Center, Yorktown Heights, NY. (Mar. 1986) Abstract only.

* cited by examiner

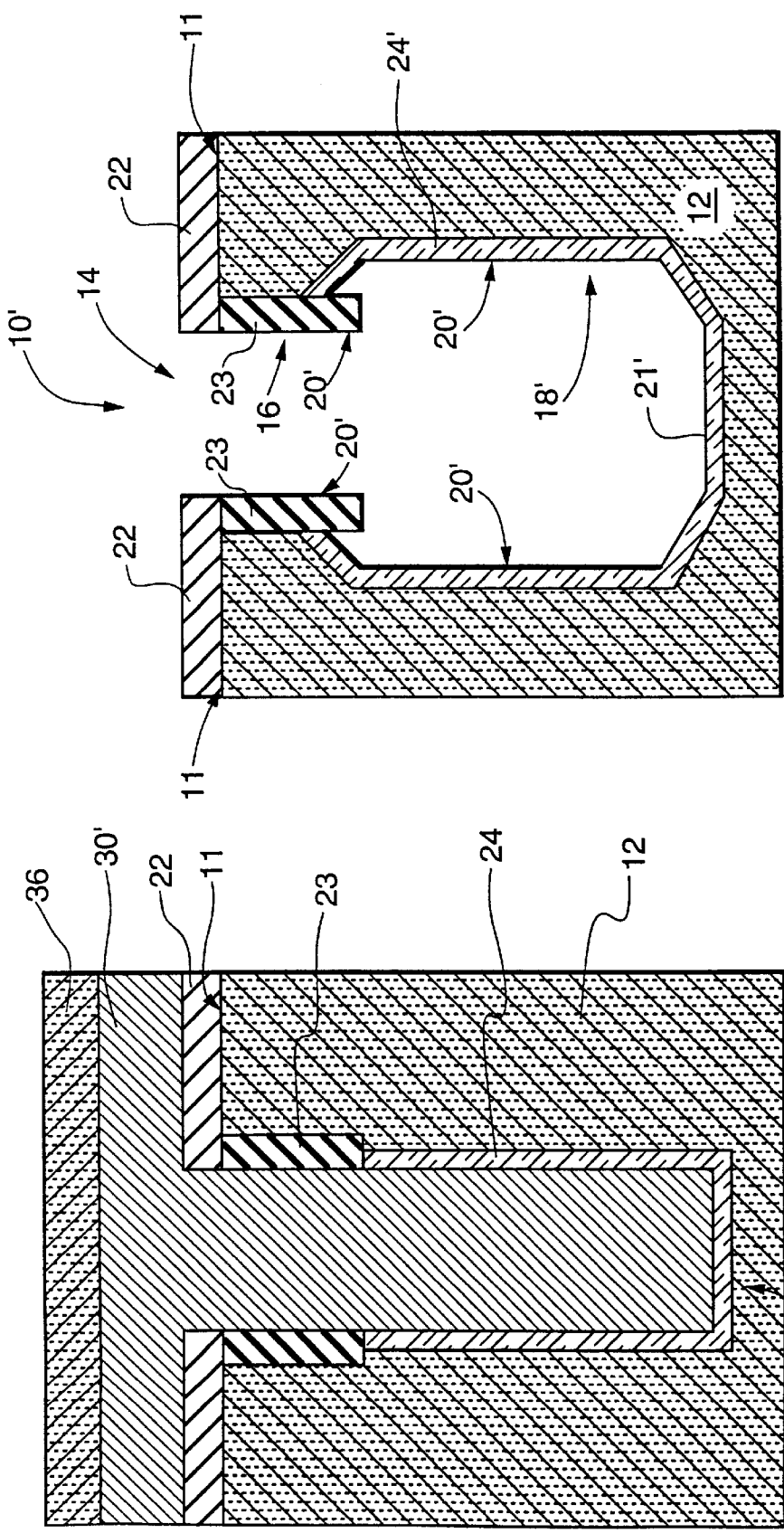

HIGH ASPECT RATIO DEEP TRENCH CAPACITOR HAVING VOID-FREE FILL

This application is a divisional of U.S. patent application Ser. No. 09/162,100, filed on Sep. 28, 1998 now U.S. Pat. No. 6,180,480, which has been allowed.

TECHNICAL FIELD

The present invention relates to methods for filing trenches in semiconductor substrates and, more specifically, to a method for achieving void-free fill of deep trench capacitors having high aspect ratios.

BACKGROUND OF THE INVENTION

In the monolithic integrated circuit technology, capacitors are a common element. Large numbers of capacitors, each associated with a Field Effect Transistor (FET), are required in Dynamic Random Access Memory (DRAM) chips. As the requirement for additional memory capacity has increased, so has the requirement for packing the capacitors at higher and higher densities. The original planar capacitor design, which creates a capacitor on the chip surface, occupies too much of the chip surface per capacitor. Capacitor designs which form the capacitors in trenches in the silicon wafer permit higher capacitor densities and are the trend for the future.

Trench capacitors require, however, deep and narrow trenches having a very high aspect ratio—often more than 40:1. Typically, trench capacitors are formed in the trench by depositing a dielectric layer on the trench walls and filling the trench with a doped polysilicon layer to form the upper capacitor plate. A doped silicon trench wall area forms the lower capacitor plate.

Trenches having an aspect ratio greater than 4:1 are generally considered to have a high aspect ratio. As deep trench aspect ratios exceed about 10:1, filling the trench becomes more and more difficult. The top portion of the trench tends to receive more deposition, thereby blocking diffusion of reactants to the bottom portion of the trench. Often, the result is the creation of voids within the fill. Such voids increase buried plate series resistance. Once the trench is filled with silicon, the voids do not disappear with additional processing. In fact, the voids may get larger as the wafers go through the various anneal cycles, especially for amorphous silicon fill.

In addition to trenches having a substantially rectangular cross section, trench structures having a bottle-shaped cross section with a narrower opening at the top than at the bottom of the trench are also used. It is theoretically impossible to completely fill such bottle-shaped trenches with a single deposition step.

To assure more complete fill of trench structures, a lower deposition temperature has been used at the expense of reduced deposition rates and longer processing times. Multiple deposition steps may be necessary, especially for bottle-shaped trenches, including etching steps between depositions to re-open the top of the trench and allow penetration of additional fill material into the trench. Such multiple steps complicate the processing sequence.

Thus, a need exists for a more practical method to fill such deep or odd-shaped trenches.

SUMMARY OF THE INVENTION

To meet this and other needs, and in view of its purposes, the present invention provides a process for making a trench capacitor in a high aspect ratio trench in a silicon wafer. The trench has an opening, opposite sidewalls, an upper portion, a lower portion, and a bottom. The silicon wafer has a top surface. The process comprises the following steps:

a) depositing a fill layer over the top surface of the wafer and in the trench, the fill layer comprising a material selected from the group consisting of germanium and silicon-germanium alloy; and b) heating the fill layer material to a temperature equal to or above the fill layer material melting temperature and below the wafer melting temperature while preventing oxidation of the fill layer material.

The process is also applicable to fill odd-shaped trenches such as bottle-shaped trenches. Although the process is particularly useful in forming trench capacitors, it is also useful in filling trenches used as contact vias where such trenches again have aspect ratios comparable to the aspect ratios of the capacitor trenches. In all such applications, the germanium or silicon-germanium alloys are doped to provide the needed low resistivity.

The process is best carried out under vacuum or under inert gas to prevent exposure of the fill layer to ambient air. Preferably, the process further comprises, following step (a), the step of depositing a cap layer on top of the fill layer capable of preventing such exposure. The cap layer is a layer of silicon.

The process results in a high-aspect-ratio, straight-wall or bottle-shaped trench structure filled completely with a fill material selected from the group consisting of germanium and silicon-germanium alloy. The fill material is doped with a conductive material. The If trench may further comprise a buffer layer and a metal layer, and/or a thermal-stress-reduction layer.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 3 shows a schematic cross-section of the trench shown in FIG. 2 after heating the fill layer;

FIG. 4 shows a schematic cross-section of a bottle-shaped trench prior to filling;

DETAILED DESCRIPTION OF THE INVENTION

Figure 1:
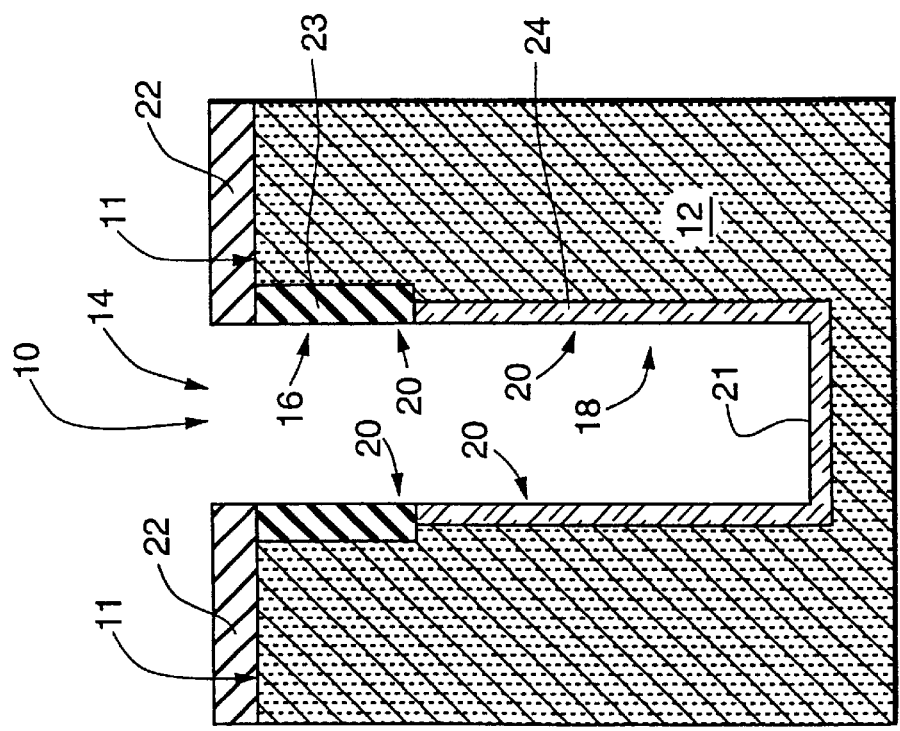
FIG. 1 shows a schematic cross-section of a conventional straight trench prior to filling.

Referring now to the drawing, wherein like reference numerals refer to like elements throughout, FIG. 1 shows a conventional straight trench 10 in a substrate 12, such as an epitaxial silicon substrate wafer, typical of trenches used for trench capacitor building. Such a trench is generally etched into the substrate by defining the area to be etched using a photolithographic mask and using Reactive Ion Etching (RIE) or some other process well known in the art to etch the desired portions of substrate 12 to the desired depth. The trench comprises an opening 14 where the trench penetrates the substrate, an upper section 16, a lower section 18, opposite sidewalls 20, and a bottom 21. Although opposite sidewalls 20 are usually substantially parallel, they may also taper toward either the top or bottom of the trench.

For capacitor trench applications, prior to etching the trench, a pad layer 22 may be grown on the top surface 11 of silicon substrate 12. Pad layer 22 is made of nitride, oxide, or a combination of both. Typically, subsequent to or in conjunction with the trench-etching process, an insulating collar layer 23 is formed in the trench upper section 16 and a node dielectric layer 24 is formed in the trench lower section 18.

Typically, the collar layer 23 extends approximately 0.5 to 2.0 microns into the trench and, in any case, to a sufficient length to decouple the inside of the trench from any electrical structures in the active area of the wafer. The total depth of the trench is determined by the desired capacitor specifications and has sufficient depth to insure adequate capacitance. Usually this means about 8 microns. The width of the trench opening is on the order of less than 2,000 Angstroms, resulting in a trench width-to-depth aspect ratio which is often above 40. Lower aspect ratios may be used, however, for specific applications.

Figure 2:
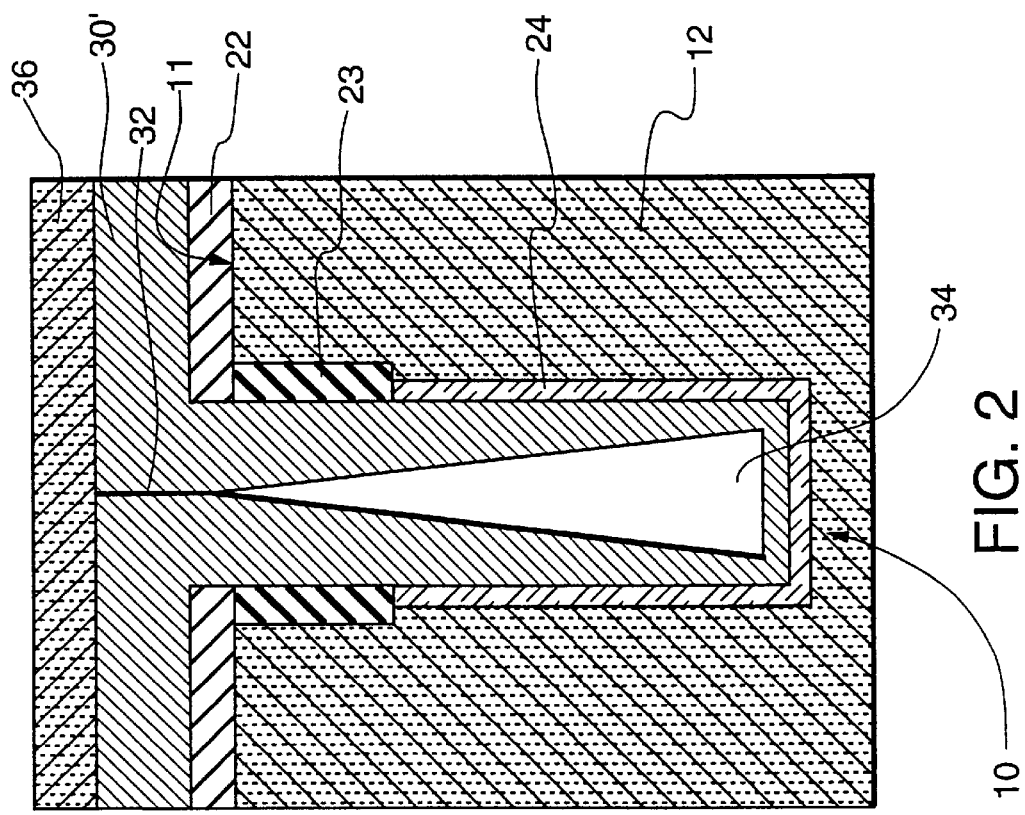
FIG. 2 shows a schematic cross-section of a trench illustrating a void at the center of the trench after initial deposition of a fill layer and cap layer.

Referring now to FIG. 2, there is shown a schematic cross-section of a trench following deposition of the fill material. This in-process trench has an undesirable void 34, typical of the result of the deposition of fill material in deep, high-aspect trenches. Typically, the fill material previously used for this application, i.e. the creation of trench capacitors, is a-silicon or polycrystalline silicon. According to the present invention, the fill material 30' comprises pure germanium or silicon-germanium alloy. The fill material is deposited over the substrate top surface 11 on pad layer 22 and over the trench sidewalls 20 and bottom 21 (in this case, on the exposed surfaces of collar layer 23 and dielectric node layer 24) as shown in FIG. 2.

The germanium or $Si_xGe_{1-x}$ fill material is typically deposited by a Chemical Vapor Deposition (CVD) process well known in the art. Pure germanium deposition can be achieved using Low Pressure CVD (LPCVD) at a deposition temperature of 350° C. with a $GeH_4$ partial pressure of 0.2 Pa to 12 Pa to achieve a steady-state deposition rate of 20 A/min. to 80 A/min. in either an $H_2$ or Ar carrier gas in a batch furnace, as described by Kobayashi et al., *J. Crystal Growth* 174, pp. 686–90 (1997). Other reactive germanium gases or other germanium or $Si_xGe_{1-x}$ growth processes can be employed. Complete fill is not critical, in this step, because large voids can be tolerated.

The deposition temperature, pressure, and gas flows can be adjusted to tune the process for optimal deposition rate or particulate performance. For reasonable germanium coverage in the trench in a single step, the overall processing range for the LPCVD furnace process is generally 300–500° C. at 0.01–30 Pa $GeH_4$ partial pressure. Deposition at temperatures above 550° C. and as high as 800° C. is possible, but may tend to give less conformal deposition. Although conformal deposition is helpful, it is not necessary because filling the voids is not a requirement at this step in the process according to the present invention.

If a single wafer processing process is used, a slightly higher temperature, up to 600° C., and a higher flow setting can be used to achieve faster deposition. An alternate gas source such as $GeF_4$ may be used in the temperature range 300 to 500° C., as described by Yamamoto et al., *Appl. Phys. Lett.* 63(18), 3508 (1993).

For deposition of the silicon-germanium alloy, simultaneous $SiH_4$ flow is added to the processes described above. By changing the $SiH_4/GeH_4$ ratio or other process parameters, the amount of silicon in the alloy can be controlled which, in turn, can be used to control the melting temperature of the alloy. Deposition of $Si_xGe_{1-x}$ alloy with x equal to about 0.5 and a deposition temperature of 620–780° C. is described by Gu et al., *J. Appl Phys.* 75(10), 5382 (1994). This process, or a low-temperature version of this process for improved initial conformal deposition, can be used to deposit the alloy.

The deposited germanium or $Si_xGe_{1-x}$ alloy must be doped with a dopant (such as As, P, or B) to form an electrically conductive path. If the source reactant gas is a hydride such as $GeH_4$, a dopant gas such as $AsH_3$, $PH_3$, or $B_2H_6$ in $H_2$ carrier gas may be used. The dopant gas may be flowed into the furnace simultaneously with the reactant gas to create the in-situ doping during deposition. In an alternate embodiment, a layered doping process may be used where the dopant gases and the reactant gases alternate, and the reaction chamber is pumped to the base pressure during the crossover between gases.

As shown in FIG. 2, the resulting fill layer has a seam 32 in the area above trench 10 where the upper surface of the fill layer on one sidewall meets the upper surface of the fill layer on the opposite sidewall, and also has a void 34 inside the trench. The thickness of the deposited germanium or $Si_xGe_{1-x}$ alloy fill material 30' is chosen such that the opening of the trench is, preferably, sealed off and that enough fill material is available to flow down into the trench void 34 to fill it completely.

On top of fill material 30', a cap layer 36 of either amorphous silicon or polycrystalline silicon is deposited in-situ by any process conventionally known in the art. The cap layer prevents the exposure of the germanium or silicon-germanium alloy surface to oxidation during the high-temperature step to follow. In the alternative, the process could be carried out under vacuum or in an inert gas atmosphere and at lower temperature, in which case a cap layer is not needed. The deposited cap layer is generally about 300 Å or more thick, sufficient to prevent oxidation of the germanium fill and serve as a diffusion barrier. Preferably, a deposition temperature in the range of 500–550° C. may be used to generate only amorphous silicon and to reduce particle generation.

Once the fill material 30' and the cap layer 36 are formed, the wafers are annealed at or just above the melting point of germanium or the specific $Si_xGe_{1-x}$ alloy used in fill material 30'. This annealing step causes fill material 30' to melt, and gravity causes the molten layer to flow down into any voids in trench 10. The process may also be carried out under elevated pressure to facilitate packing of the fill into the trench. In addition to preventing oxidation, the cap layer of silicon also serves as protective cover for the molten germanium or silicon-germanium alloy so that the liquid flows into the void and does not exit the wafer.

Heating of the fill material 30' may be either indirect, wherein the whole wafer is heated, or it can be direct. Direct heating may be achieved using a focused laser beam, such as an XECL excimer laser beam, to heat the fill material 30' in the trench. The use of a laser beam and the optics needed to locally heat material are known in the art and need no further elaboration.

Referring now to FIG. 3, there is shown a schematic cross section of the resulting void-free fill for the conventional, straight trench 10 of FIG. 2. Fill material 30' now is a conformal layer completely filling trench 10 and free of any voids or seams. The fill material 30' is slightly reduced in thickness over substrate top surface 11 due to movement of material into the trench to fill void 34. This reduced thickness is not significant, however, because this layer will be discarded. Any conventional processing such as Chemical Mechanical Polishing (CMP) or RIE may be used to etch back the unnecessary material after the melt-flow step.

The composition of the $Si_xGe_{1-x}$ alloy must be selected to ensure proper melting, flow, and containment of mixing of the alloy layer with the top silicon cap layer. The practical range of germanium atomic percentage in the alloy is between 100% (pure germanium) and about 33%. The annealing step is conducted at or just above the melting point of the alloy. Higher temperatures increase mixing of the germanium or alloy layer with the silicon cap layer, potentially causing a breach in the cap layer. Therefore, the melting proceeds at or just above the alloy melting temperatures shown in Table 1. Depending on the subsequent thermal cycling of the wafers, the composition of the alloy (and thus the melting temperature) is optimized to ensure that the material inside the trench is stable throughout the processing sequence.

TABLE 1

| Atomic % Ge | Atomic % Si | Melt. Temp. (Deg. C.) |
| --- | --- | --- |
| 100% | 0% | 938.4 |
| 90% | 10% | 967 |
| 80% | 20% | 998 |
| 70% | 30% | 1027 |
| 60% | 40% | 1063 |
| 50% | 50% | 1104 |
| 40% | 60% | 1170 |
| 33% | 67% | 1200 |

Some mixing of the fill material 30' with the cap layer 36 will occur during melting. By controlling the thickness of the fill material and the cap layer so that enough silicon material is present, and by keeping the melting temperature close to the melting temperature of the germanium or $Si_xGe_{1-x}$ alloy, such mixing can be controlled so that pure silicon remains on the top surface even at the end of the annealing step. The silicon serves as a protective layer against the oxidation of the fill layer below, should such protection be necessary in view of subsequent treatment of the wafer.

Any conventional processing technique such as CMP or RIE can be used to remove the unnecessary material after the melt-flow process. The alloy in the final structure is stable during subsequent thermal processing as long as the processing temperature does not exceed the melting temperature of the alloy.

Referring now to FIG. 4, there is shown an alternate trench embodiment in the form of a bottle-shaped trench 10' in substrate 12. Trench 10' has an opening 14 in the pad layer 22, an upper section 16, and collar layer 23—all similar to the conventional straight trench 10 shown in FIG. 1. Bottle-shaped trench 10' has a wider bottom 21', however, and a greater distance between sidewalls 20' in its lower section 18' than in its upper section 16. The corresponding node dielectric layer 24' conforms to the sidewalls 20'. Formation of such a trench typically involves more processing steps than a straight trench, such as an additional isotropic etching of the lower section 18' using an etch barrier on the sidewalls of the upper section 16 or "neck" of the bottle to prevent etching in that section.

Figure 5:
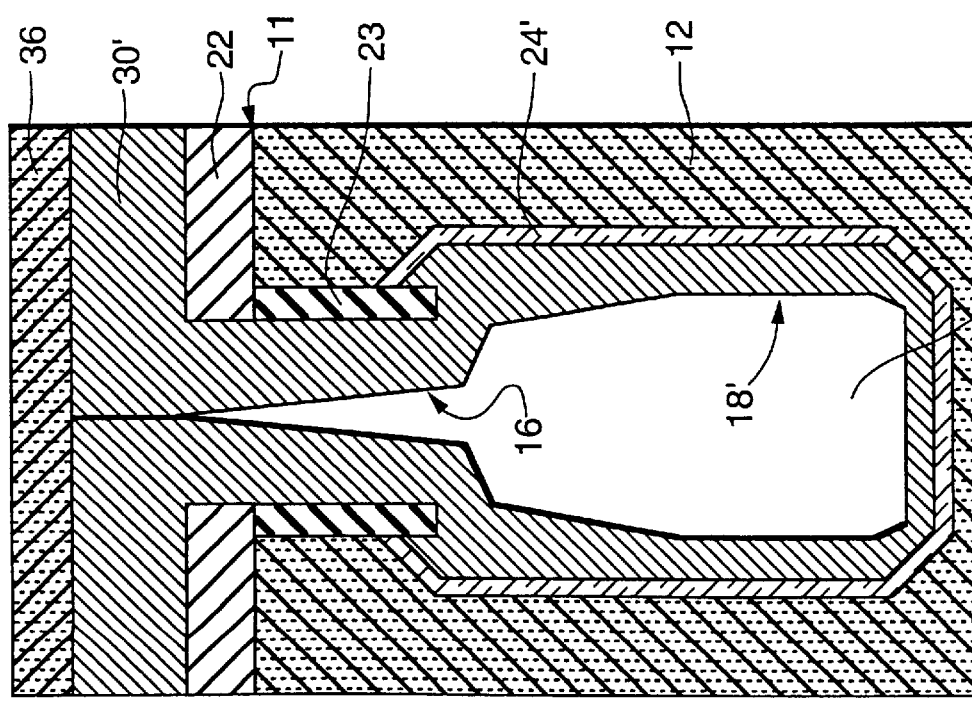
FIG. 5 shows a schematic cross-section of the bottle-shaped trench of FIG. 4 after deposition of a fill layer and a cap layer, illustrating the void in the trench.

Referring now to FIG. 5, there is shown the alternate, bottle-shaped trench embodiment 10' of FIG. 4, having similar elements to the straight trench 10 of FIGS. 1–3, after deposition of the fill material 30' and cap layer 36'. Because the lower portion 18' of trench 10' is wider as compared to lower portion 18 of trench 10, the volume of void 34' is also larger. Thus, the change in thickness of fill layer 30' over the top surface 11 of substrate 12 after melting is also larger; more fill material is needed to fill the void.

Figure 6:
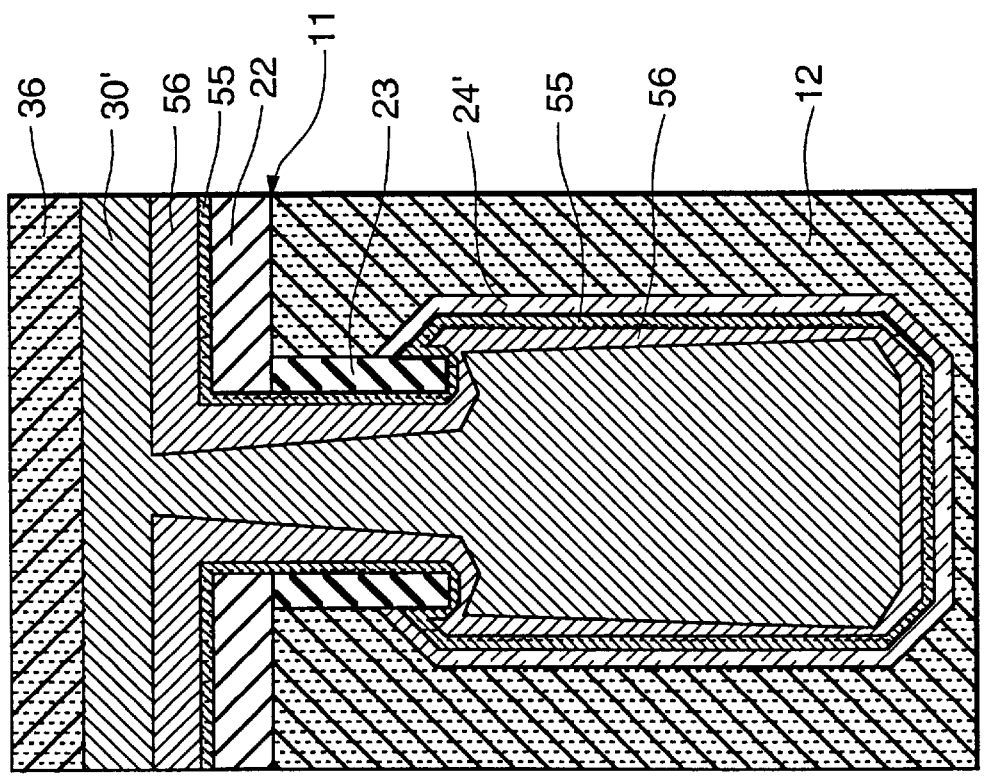
FIG. 6 shows a schematic cross-section of a bottle-shaped trench having a buffer layer, a metal layer, a fill layer, and a cap layer, after heating the fill layer.

In yet another alternate embodiment, shown in FIG. 6, the melting and flowing properties of germanium and $Si_xGe_{1-x}$, alloys can be used as a fill for a trench having metal layers to increase conductivity within the trench. Referring to FIG. 6, there is shown the bottle-shaped trench 10' of FIG. 4, having layers in trench 10' as described above. After collar layer 23 and node dielectric layer 24' are formed, a buffer layer 55 is formed to prevent direct contact of the node dielectric with the metal layers to follow. The buffer material can be amorphous silicon, polycrystalline silicon, germanium, or silicon-germanium alloy, as long as the deposition is conformal and provides minimum spacing of approximately 100 Å throughout the trench area. The buffer layer may be doped with As, P, or B to enhance its electrical conductivity.

Next, metal layer 56 is deposited, preferably by a CVD process such as the blanket tungsten CVD process well-known in the semiconductor industry. Although a CVD process is preferred to provide as much conformability and continuity in the metal layer as possible, a very conformal PVD process with some discontinuity in the film may also be sufficient. Even if the film after this step is non-conformal, as long as there is a continuous layer of metal within the trench, the conductivity of the trench will decrease by orders of magnitude due to the presence of the metal. About 200 Å or more of the metal layer is sufficient for this purpose.

Next, the fill material 30' and cap layer 36 are applied, as previously described, and the annealing step is conducted to melt-flow the germanium or $Si_xGe_{1-x}$ alloy to eliminate any voids. Similar addition of a buffer layer and a metal layer prior to filling can also be performed in the straight trench embodiment of FIG. 1.

Because silicon and germanium have different thermal expansion coefficients (silicon=$4.68 \times 10^{-6}$, germanium=$6.1 \times 10^{-6}$, both at 300° K), high-temperature thermal cycling can induce stress if a significant amount of germanium is used to fill the trenches, especially in the case of a bottle-shaped trench. Therefore, in an alternate embodiment, an additional thermal-stress-reduction layer of silicon may be added prior to the germanium fill. This layer may be either amorphous silicon or polycrystalline silicon, and may be added to either the straight or bottle-shaped trench embodiment, with or without the metal and buffer layers.

In the straight trench embodiment of the type shown in FIG. 1, deposition of the fill material 30' can simply be split into two steps. The first step is depositing a layer of amorphous or polycrystalline silicon; the second step is depositing a layer of germanium or silicon-germanium alloy. The silicon layer can vary in thickness, depending on geometry, in the range of about 100–600 Å. Most important, an opening must remain at the top of the trench, after depositing the silicon layer, so that the germanium or silicon-germanium alloy can flow through during melting.

For the trench embodiment having the metal and buffer layers of the type shown in FIG. 6, there are three ways to add the silicon layer. In a first embodiment, the silicon layer may be a first sublayer of buffer layer 55, while the rest of buffer layer 55 and all of fill material 30' are germanium or silicon-germanium alloy. In a second embodiment, all of buffer layer 55 may be silicon, making the buffer layer itself the thermal-stress-reduction layer, while all of fill material 30' may be germanium or silicon-germanium alloy. In the third embodiment, all of buffer layer 55 and a first sublayer of fill material 30' may be silicon, while the remaining portion of fill material 30' is germanium or silicon-germanium alloy.

Where present, the silicon sublayer of fill material 30' must be thin enough so that there is still enough of an opening at the top of the trench for the germanium or silicon-germanium alloy to melt-flow into the trench. The addition of the thermal-stress-reduction layer reduces the thermal expansion mismatch of the substrate and the fill material by depositing more silicon material within the trench.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A trench capacitor comprising:
   a substrate having a surface;
   a trench having a high aspect ratio formed in the substrate, the trench having opposite sidewalls, an upper portion, a lower portion, and a bottom; and
   a fill material completely filling the trench, the fill material doped with a conductive dopant and comprising a material selected from the group consisting of germanium and silicon-germanium alloy.

2. The trench capacitor according to claim 1 wherein the trench has a bottle-shaped cross-section whereby the opposite sidewalls in the lower portion have a greater distance between them than the opposite sidewalls in the upper portion.

3. The trench capacitor according to claim 1 further comprising a thermal-stress-reduction layer underneath the fill material and over the trench sidewalls and bottom, the thermal-stress-reduction layer comprising a material selected from the group consisting of amorphous silicon and polycrystalline silicon.

4. The trench capacitor according to claim 3 wherein the buffer layer is a conformal layer having a thickness of at least approximately 100 Angstroms.

5. The trench capacitor according to claim 3 wherein the buffer layer is doped with a material selected from the group consisting of As, P, and B.

6. The trench capacitor according to claim 1 further comprising a buffer layer, underneath the fill material and over the trench sidewalls and bottom, and a metal layer over the buffer layer, the buffer layer comprising material selected from the group consisting of amorphous silicon, polycrystalline silicon, germanium, and silicon-germanium alloy.

7. The trench capacitor according to claim 6 further comprising a thermal-stress-reduction layer between the buffer layer and the metal layer, the thermal-stress-reduction layer comprising a material selected from the group consisting of amorphous silicon and polycrystalline silicon.

8. The trench capacitor according to claim 7 wherein the thermal-stress-reduction layer has a thickness of between 100–600 Angstroms.

9. The trench capacitor according to claim 6 further comprising a thermal-stress-reduction layer between the metal layer and the fill material, the thermal-stress-reduction layer comprising a material selected from the group consisting of amorphous silicon and polycrystalline silicon.

\* \* \* \* \*